United States Patent
Ramaraju et al.

(10) Patent No.: US 8,677,205 B2
(45) Date of Patent: Mar. 18, 2014

(54) HIERARCHICAL ERROR CORRECTION FOR LARGE MEMORIES

(75) Inventors: Ravindraraj Ramaraju, Roung Rock, TX (US); Edmund J. Gieske, Cedar Park, TX (US); David F. Greenberg, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 380 days.

(21) Appl. No.: 13/045,307

(22) Filed: Mar. 10, 2011

(65) Prior Publication Data

US 2012/0233498 A1   Sep. 13, 2012

(51) Int. Cl.
H03M 13/00   (2006.01)

(52) U.S. Cl.
USPC .......................... 714/755; 714/6.1

(58) Field of Classification Search
USPC .......................... 714/5.1, 755, 6.1
See application file for complete search history.

(56) References Cited

U.S. PATENT DOCUMENTS

| | | | |
|---|---|---|---|
| 3,685,014 A | | 8/1972 | Hsiao et al. |
| 4,236,247 A | * | 11/1980 | Sundberg ...................... 714/765 |
| 5,058,116 A | * | 10/1991 | Chao et al. ..................... 714/764 |
| 5,383,205 A | | 1/1995 | Makihara et al. |
| 5,793,693 A | * | 8/1998 | Collins et al. ............. 365/230.01 |
| 6,480,975 B1 | | 11/2002 | Arimilli et al. |
| 6,622,260 B1 | * | 9/2003 | Marisetty et al. ............... 714/10 |
| 6,662,333 B1 | | 12/2003 | Zhang et al. |
| 7,389,465 B2 | | 6/2008 | Radke et al. |
| 7,562,283 B2 | * | 7/2009 | Falik et al. .................... 714/785 |
| 7,590,920 B2 | | 9/2009 | Yang et al. |
| 7,930,612 B2 | * | 4/2011 | Radke et al. ................... 714/755 |
| 8,276,039 B2 | * | 9/2012 | Wuu et al. ..................... 714/758 |
| 2009/0222708 A1 | | 9/2009 | Yamaga |
| 2013/0227369 A1 | | 8/2013 | Ramaraju et al. |

FOREIGN PATENT DOCUMENTS

| | | |
|---|---|---|
| EP | 0107038 A2 | 5/1984 |
| WO | 03/040922 A2 | 5/2003 |

OTHER PUBLICATIONS

Hsaio, M.Y, "A Class of Optimal Minimum Odd-weight-column SEC-DED Codes," Jul. 1970, printed from <<http://www.cs.berkeley.edu/~culler/cs252-s02/papers/hsiao70.pdf>> on Nov. 3, 2011, pp. 395-401.

Kim, J. et al., "Multi-bit Error Tolerant Caches Using Two-Dimensional Error Coding," 40th IEEE/ACM International Symposium on Microarchitecture, 2007, pp. 197-209.

Lu et al., "Architectural-Level Error-Tolerant Techniques for Low Supply Voltage Cache Operation," IEEE International Conference on IC Design & Technology, May 2-4, 2011; 5 pages.

Non-Final Office Action mailed Nov. 25, 2013 for U.S. Appl. No. 13/405,965, 22 pages.

* cited by examiner

Primary Examiner — Philip Guyton

(57) ABSTRACT

A mechanism is provided for detecting and correcting a first number of bit errors in a segment of data stored in a memory region being read, while concurrently detecting the presence of higher numbers of bit errors in that segment of data. In the event of detection of a higher number of bit errors in any single segment of data of the memory region, error correction of that higher number of bit errors is performed on the memory region, while concurrently detecting the presence of an even higher level of bit errors. By performing error correction of higher levels of bit errors in such a hierarchical order, memory latency associated with such error correction can be avoided in the majority of data accesses, thereby improving performance of the data access.

20 Claims, 6 Drawing Sheets

HIERARCHICAL ERROR CORRECTION FOR LARGE MEMORIES

FIELD

This disclosure relates generally to memory error correction, and more specifically, to a mechanism for reducing memory latency by selectively engaging higher levels of memory error correction, as needed.

BACKGROUND

As production geometries of processor systems with their associated memories decrease, the opportunities for defects in the finished products increase. These defects, along with other physical events (e.g., cosmic ray passage), can result in increasing bit error rates in system memories. Along with increasing single bit error rates are the increasing probability of double bit errors in a given area of memory.

To enable quick access to data, processors store recently accessed data in cache memory. To further increase speed of data access, cache memory can be stored in varying levels, each designed to provide data to a next level of cache memory or to the processor.

In cache memory, increasing errors presents additional challenges. In order to take advantage of the speed improvements provided by cache memories, memory cache lines should reliably provide accurate data with minimal memory latency. But double bit and higher error detection mechanisms can take multiple clock cycles and thereby increase memory latency. If such errors are not corrected, then data reloads of a cache line from the system memory or rebooting the system may be in order, which delays processing even further. It is therefore desirable to provide a mechanism for detecting and correcting memory errors while avoiding consumption of clock cycles by data reloads or unnecessary use of higher order error correction techniques, but still making use of single-bit error correction to handle the most common errors.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
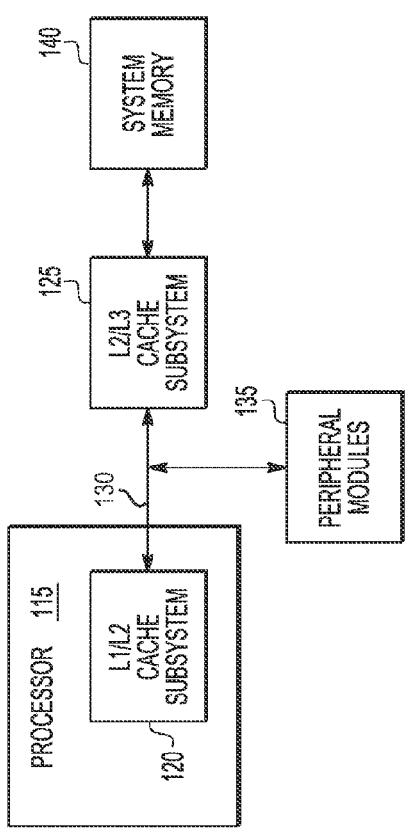
FIG. 1 illustrates a data processing system usable with embodiments of the present invention.

Embodiments of the present invention provide a mechanism for detecting and correcting a first number of bit errors in a segment of data stored in a memory region being read, while concurrently detecting the presence of higher numbers of bit errors in that segment of data. In the event of detection of a higher number of bit errors in any single segment of data of the memory region, error correction of that higher number of bit errors is performed on the memory region, while concurrently detecting the presence of an even higher level of bit errors. By performing error correction of higher levels of bit errors in such a hierarchical order, memory latency associated with such error correction can be avoided in the majority of data accesses, thereby improving performance of the data access.

In one embodiment of the present invention, data stored in a cache memory cache line is divided into segments on which single bit error correction and double bit error detection (SEC-DED) is performed, resulting in modified cache line data. For each segment in which a double bit error is detected, a flag is set. If a flag has been set, then a double bit error correction and triple bit error detection (DEC-TED) is performed on the entire modified cache line data, using an identification of the segment associated with the flag to reduce the time for locating and correcting the double bit error. In order to avoid memory latency associated with performing double bit error correction, DEC-TED is only performed if a double bit error is detected during the SEC-DED stage (e.g., a flag is set). Further, by performing double bit error correction, latencies due to cache line reloads from system memory or system unavailability due to system reboots is avoided where those errors are corrected. In one embodiment of the present invention, a likelihood of the presence of a double bit error in a single segment is reduced by interleaving data bits of each segment included in a cache line.

Today's high density memories can be subject to increased incidents of bit errors than lower density memories. Process technologies used to manufacture high density memories can result in defects that cause persistent weak bits. Further, multiple neighboring bits can be subject to these defects due to processing. In addition, transient bit errors can affect multiple neighboring bits in high-density memories.

Single bit error correction methods have been used to correct occurrences of errors in a single bit of an area of memory. Single bit error correction methods, such as Hamming code methods, are attractive because they can be performed in a manner that has a minimal impact on memory latency (e.g., in a single clock cycle). But single bit error correction methods cannot correct both a transient bit error and a persistent weak bit error occurring in the same area of memory. In a circumstance where a region of memory has a double bit (or higher) error, and only single bit error correction is used, that region of memory will require reloading from a data source to correct the error. Such reloading increases memory latency due to cycles spent requesting, reading, and loading the data from the source to the region of memory.

To resolve issues related to double bit errors, polynomial code based error correction methods, such as Bose-Chaudhuri-Hocquenghem (BCH) code, can be used. These double bit error correction methods have an advantage over single bit error correction methods in that they can significantly improve memory reliability. For example, double bit error correction methods can correct both a transient bit error and a persistent weak bit error in a same area of memory. While double bit error correction methods are robust, the process of determining the location of the errors and correcting the errors are non-trivial and can result in significantly longer memory latencies than those found in single bit error correction methods.

Thus, traditionally, a tradeoff has been required between memory latency and memory reliability through correction of higher numbers of bit errors. Embodiments of the present invention resolve this tradeoff by detecting and correcting single bit errors in a memory segment, while also detecting the presence of a double bit error in that memory segment. Only if a double bit error is detected is double bit error correction performed on a memory region containing the memory segment. By performing error correction in such a hierarchical fashion, latencies due to performing double bit error correction are only incurred when needed.

FIG. 1 is a simplified block diagram illustrating a data processing system 110 usable with embodiments of the present invention. Data processing system 110 includes a processor 115 having a level one/level two (L1/L2) cache subsystem 120, a level two/level three (L2/L3) cache subsystem 125, peripheral modules 135, and a system memory 140. The processor is coupled to the peripheral modules and the system memory by a bus 130. L2/L3 cache subsystem 125 is coupled to processor 115 by bus 130. L1/L2 cache subsystem 120 can be implemented as one or both of a level one and a level two cache, depending on the architecture of processor 115. Similarly, L2/L3 cache subsystem 125 can be implemented as one or both of a level two and level three cache. Although L1/L2 cache subsystem 120 is shown as part of processor 115, the L1/L2 cache subsystem can be coupled to processor 115 by bus 130 or another bus. Further, one or both of the L1 or L2 cache can be integral with the processor and the other coupled to the processor by a bus. Similarly, L2/L3 cache subsystem 1125 can be incorporated into processor 115 or coupled to processor 115 by a bus other than bus 130. Cache subsystems 120 and 125 can be configured with set multi-way associative cache memories or any other suitable cache memories.

Figure 2:
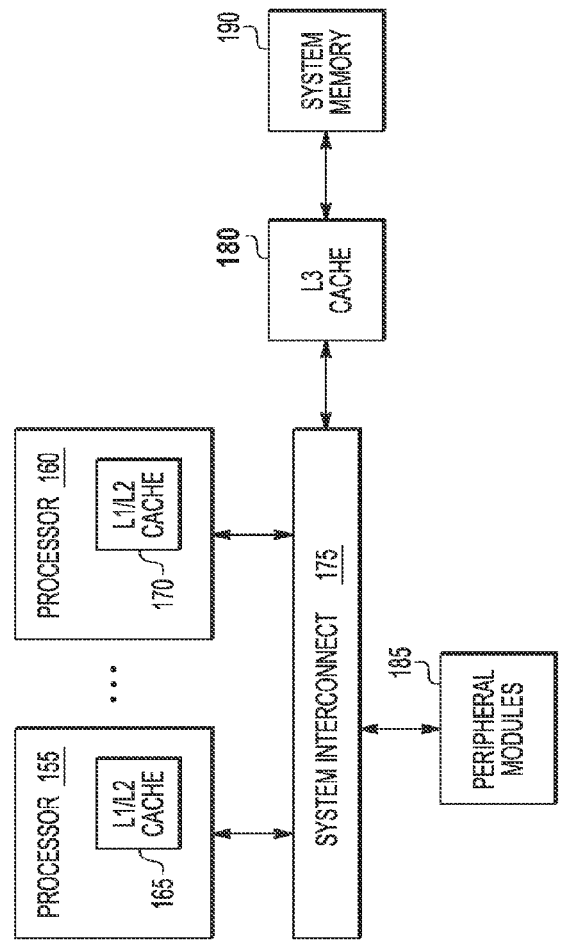
FIG. 2 illustrates an alternative data processing system usable with embodiments of the present invention.

FIG. 2 is a simplified block diagram illustrating an alternative data processing system 150 usable with embodiments of the present invention. Data processing system 150 includes one or more processor cores, illustrated by processors 155 and 160. The processor cores each include an L1/L2 cache subsystem, illustrated by L1/L2 cache subsystems 165 and 170, respectively. The processors are coupled to a system interconnect 175 configured to provide communications between the processors and a L3 cache subsystem 180 and peripheral modules 185. L3 cache subsystem 180 is also coupled to a system memory 190. As with FIG. 1A, although L1/L2 cache subsystems 165 and 170 is shown as part of processors 155 and 160, respectively, the L1/L2 cache subsystems can be coupled to the processors a bus. Further, the L1 and L2 caches represented by L1/L2 cache subsystems 165 and 170 can be implemented by separate subsystems (e.g., an L1 cache subsystem and an L2 cache subsystem) with one of the subsystems incorporated in the processor and another coupled to the processor by a bus.

In a typical embodiment, the L1, L2, and L3 cache subsystems each comprise an application appropriate amount of static random access memory (SRAM) and the system memory comprises an application appropriate amount of dynamic random access memory (DRAM).

The term "bus" is used to refer to a plurality of signals or conductors which may be used to transfer one or more various types of information, such as data, addresses, control, or status. The conductors may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Figure 3:
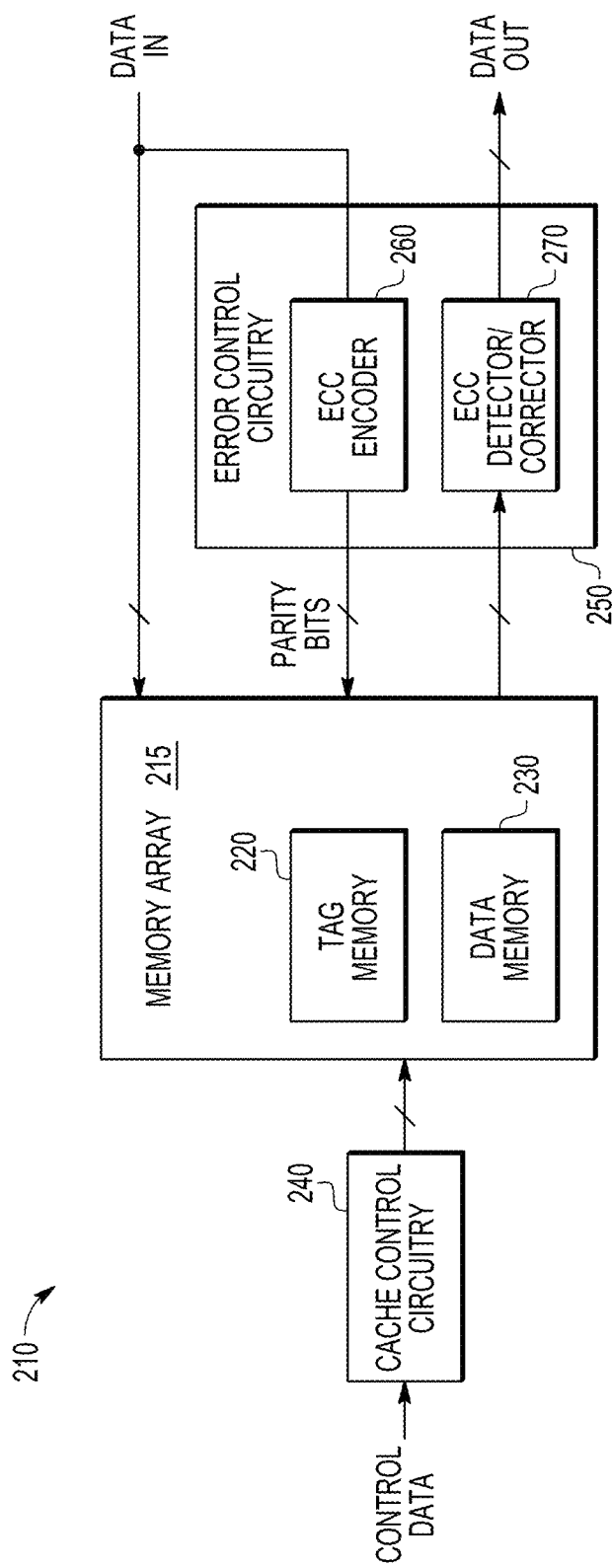
FIG. 3 illustrates an exemplary cache subsystem, usable to implement embodiments of the present invention.

FIG. 3 is a simplified block diagram illustrating an exemplary cache subsystem 210, usable with embodiments of the present invention. Cache subsystem 210 includes a memory array 215 and a cache control circuitry 240 coupled to the memory array. Memory array 215 can include a tag memory 220 and a data memory 230. Error control circuitry 250 is also coupled to the memory array. Cache subsystem 210 can be implemented, for example, as an L2 or L3 cache subsystem. Tag memory 220 includes a plurality of tag cells. Data memory 230 can store instructions or data. Tag memory 220 and data memory 230 can be incorporated in a single memory array 215 or functionally separate memory arrays. Cache control circuitry 240 can receive address and access information from a processor core via a control data input.

Error control circuitry 250 can provide both error encoding and error decoding functionality. As data is received from system memory (e.g., 140 or 190) or a processor core (e.g., 115, 155 or 160), an ECC encoder 260 can generate parity bits for use in subsequent error checking and correction. For the hierarchical error correction scheme described herein, parity bits are generated for an entire cache line's complement of data. As described below, these parity bits are used for the higher numbers of bit error detection and correction. In addition, the cache line is broken down into a number of data segments. Parity bits are also generated by ECC encoder 260 for each of the segments. These parity bits are used for the first level error correction and detection described herein. It should be understood that the mechanism for generating the parity bits is associated with the method used for decoding those parity bits during subsequent memory access and accompanying error correction and detection. The parity bits are stored in association with their related segments and cache lines. Thus, for each cache line there is stored not only the data retrieved from system memory (or generated by a processor), but also parity bits associated with the entire cache line and with each segment of the cache line.

Error control circuitry 250 also includes error detection/correction circuitry 270 for analyzing parity bits and associated data and taking actions in light of that analysis. Operation and implementation of error detection/correction circuitry 270 is detailed below with regard to embodiments of the present invention. Although the invention is described with reference to specific embodiments, various modifications and changes can be made without departing from the scope of the present invention. Accordingly, the descriptions presented of the error detection/correction logic are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Figure 4:
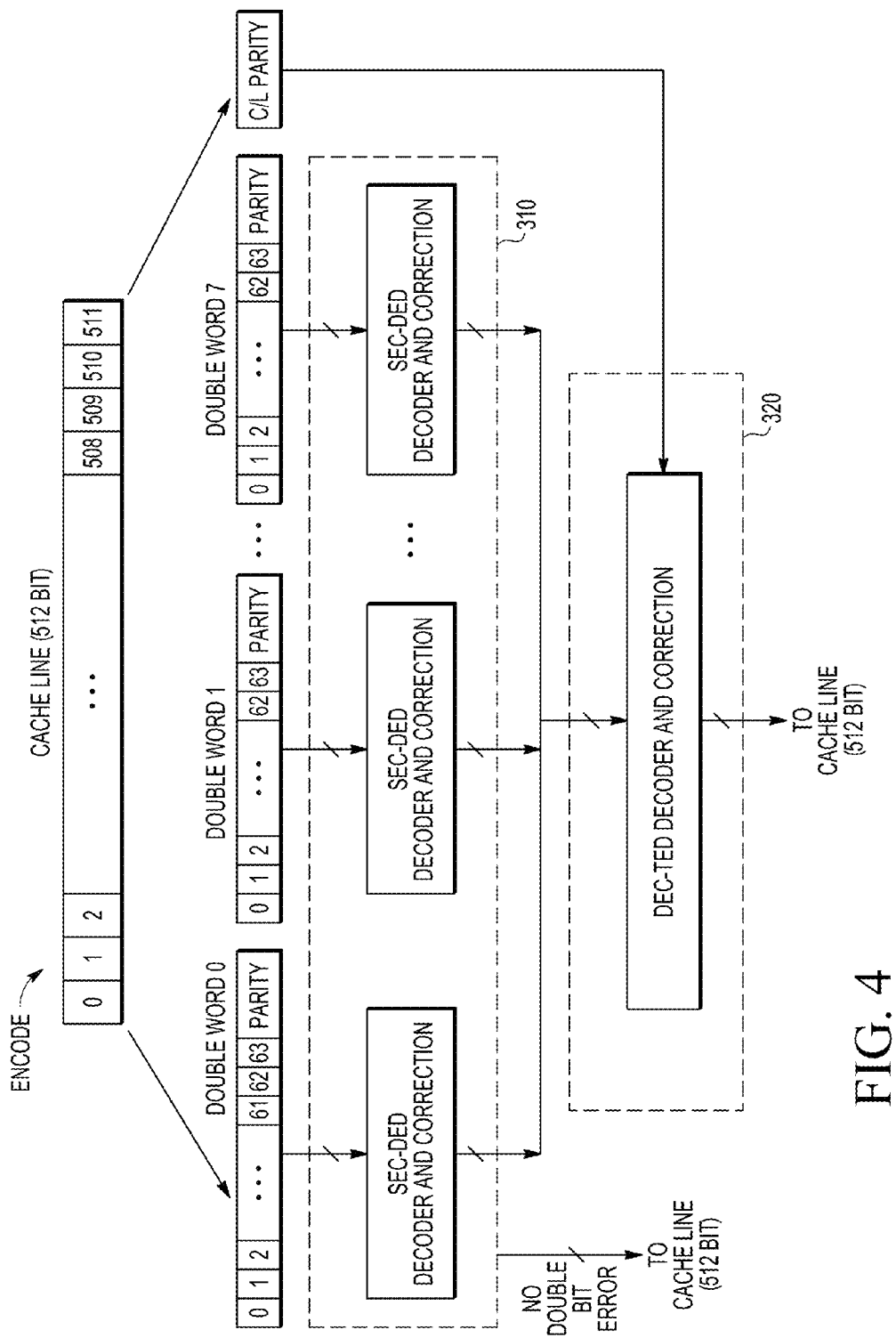
FIG. 4 illustrates an example of a hierarchical error correction implementation for data stored in a memory region, in accord with embodiments of the present invention.

FIG. 4 is a simplified block diagram illustrating an example of a hierarchical error correction implementation for data stored in a memory region, in accord with embodiments of the present invention. As illustrated, the memory region is an L2 cache line including 512 bits. The cache line can be divided into a set of memory segments, which are here illustrated as eight 64-bit double words. The number of bits in the cache line, and the size and number of memory segments, can vary depending upon the implementation of the cache subsystem. The inventive concepts described herein are not limited to any particular size of memory region or memory segment. Further, embodiments of the invention are not limited solely to correction of any particular type of memory (e.g., cache memory).

During a read access of the cache line, single bit error correction and double bit error detection (SEC-DED) is performed on each of the memory segments during SEC-DED stage 310. In one embodiment of the present invention, such SEC-DED is performed using a linear error-correcting code such as a Hamming code. SEC-DED Hamming codes can detect up to two bit errors in a segment and correct single bit errors. In order to perform such error correction and detection, additional parity bits are stored with each memory segment during error encoding, as described above. The number of parity bits is dependent upon the size of the memory segment and the type of error correction used. For the illustrated 64-bit double words and a SEC-DED Hamming code, an additional eight parity bits are needed. Thus, 72 bits of storage are required for the data and parity of each double word.

SEC-DED can be performed on each segment in a single clock cycle. The number of segments that can be decoded and corrected simultaneously is dependent upon a number of SEC-DED decoder/correctors included in ECC detector/correction logic 270 and a bandwidth of the data bus providing memory region data to the error correction/detection logic. In one embodiment, four double words are decoded and corrected in a single clock cycle, thereby taking two clock cycles to decode and correct the entire cache line.

If no double bit errors in any of the memory segments are detected, then the corrected data can be used to update the memory region and to service the access request. For example, if no double bit errors are detected in any double word, the corrected data can be provided back to data memory 230 for updating the cache line and to service the access request. If, however, a double bit error is detected in any of the memory segments, a flag associated with the memory segment can be set. Once all of the memory segments associated with the memory region have been decoded and corrected, a determination is made of the number of set flags. If one flag is set (meaning one double bit error in a memory segment has been detected), then a second level of error correction and detection can be performed on the entire memory region. If more than one flag is set, this means that there are more than one set of double errors detected in the memory region and the data in the cache line contains too many errors to correct. In this case, a determination is then made whether to reload the data from system memory (or another cache, if present) if the data has not been modified, or to otherwise handle the error if the data has been modified (e.g., reboot the system).

If one flag has been set, then double error correction and triple error detection (DEC-TED) is performed on the entire memory region during DEC-TED stage 320, by a DEC-TED decoder/corrector in, for example, ECC detector/corrector circuitry 270. In one embodiment of the present invention, DEC-TED is performed using a polynomial error-correcting code such as a BCH code. In order to perform DEC-TED, additional parity bits are needed for the entire memory region. For example, for a 512 bit cache line, an additional 20 parity bits are used. If only a double bit error is present in one of the memory segments, then that double bit error is corrected. This improves system availability over only using a SEC-DED mechanism by avoiding either lengthy data reloads or system reboots. Only if more than a double bit error is detected, will a data reload or other error handling (e.g., reboot) be needed.

DEC-TED methods are typically more resource intensive than SEC-DED methods, and thereby require several clock cycles to perform the error correction and detection, including locating the positions of the bits in error. This time is reduced by embodiments of the present invention through the use of the double-bit error flag associated with the memory segment. By providing an identification of the memory segment flagged for double bit error, the search region for the DEC-TED method can be limited to that memory segment. For example, the 512 locations of the cache line are narrowed to 64 locations. A syndrome equation associated with the DEC-TED code can be optimized for the specific memory segment, thereby reducing the computation needed to solve the DEC-TED code for the memory region.

If no triple-bit errors in the memory region are detected, then the corrected data can be used to update the memory region and to service the access request. Again, if a triple-bit error is detected in the memory region, then a data reload or other error handling will be performed.

Figure 5:
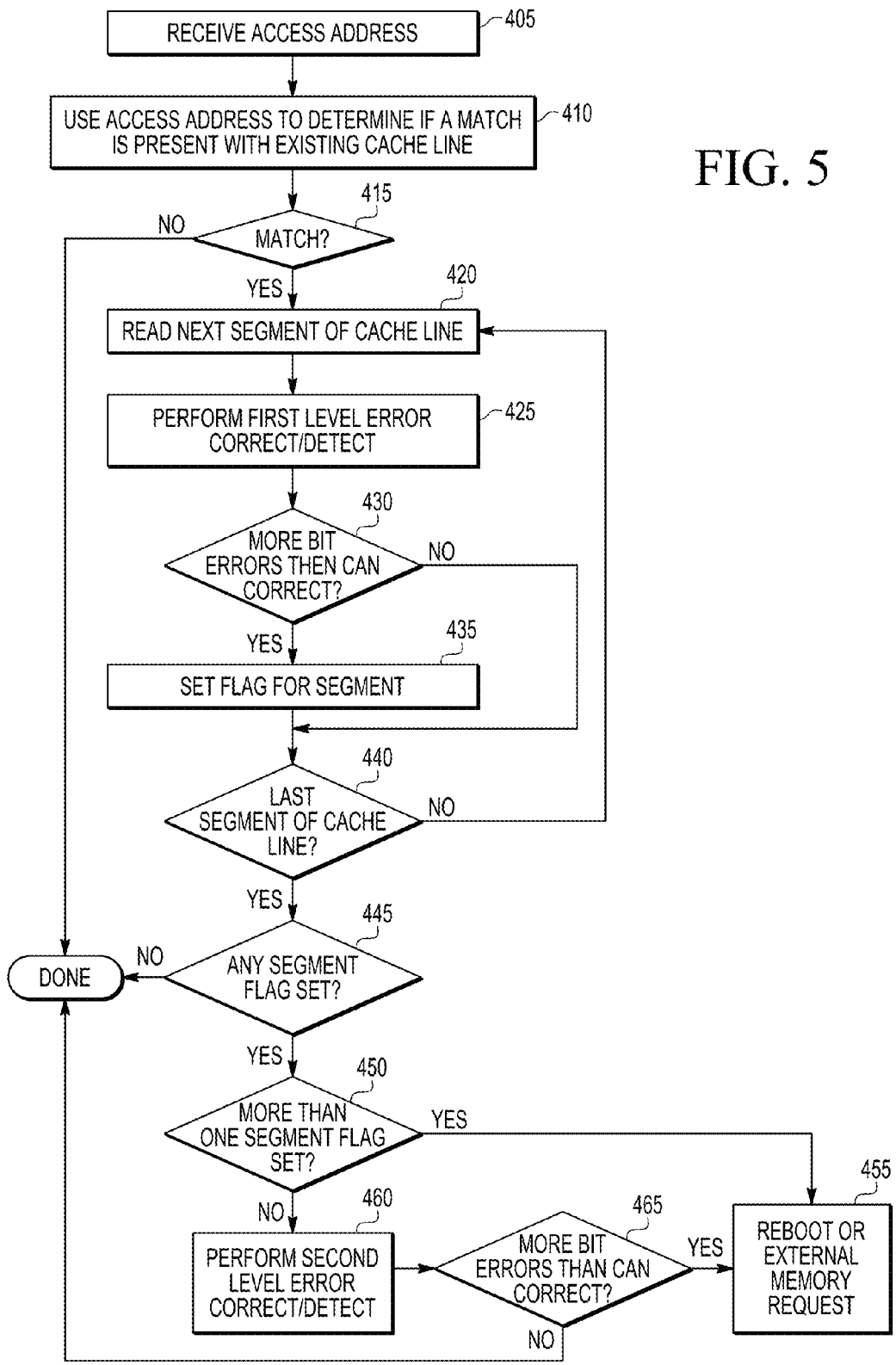
FIG. 5 illustrates steps performed in the hierarchical error correction scheme of embodiments of the present invention.

FIG. 5 is a simplified flow diagram illustrating steps performed in the hierarchical error correction scheme of embodiments of the present invention. These steps can be performed by one or more components of a memory controller incorporating error control circuitry configured to implement embodiments of the present invention (e.g., cache memory subsystem 210). The discussion below refers to cache line memory and a cache memory subsystem as examples, but techniques presented can be applied to other memory regions and memory subsystems.

The illustrated method begins with receipt of a message containing a memory access address (405). Such a message can be generated by a processor core executing a program seeking to read a memory location corresponding to the memory access address. In one embodiment, cache control circuitry 240 receives the message containing the memory access address. Subsequently, the cache control circuitry determines whether a match to the memory access address is stored in an existing cache line (410). If no cache line contains matching data (415), then the remainder of the error detection and correction process is not performed. For example, the cache memory can proceed with loading the requested data into a cache line and encoding the data for future error correction and detection.

If a cache line contains data matching the requested memory access address (415), then a sequence of steps for analyzing segments of the matching cache line for errors are performed. A segment of the cache line is read (420) and a first level of error correction and detection is performed on the segment (425). As discussed above, in one embodiment of the present invention, a segment of the cache line is a double word (64 bits). For a SEC-DED analysis, a number of parity bits are generated when the data is stored and used when the error analysis is performed. In the case of a double word, the number of parity bits used for a SEC-DED Hamming code is eight. As described above, when using a SEC-DED analysis, single bit errors in each double word are corrected. In addition, any double bit errors are detected. In embodiments of the present invention, SEC-DED Hamming codes are chosen to correct cache line errors because the data can be decoded and corrected in one clock cycle. In scenarios where higher error rates are anticipated or in which memory latency does not have a great impact on performance, it may be advantageous to use double error correcting and triple error detecting polynomial codes, for example, as a first level of error correction. If more bit errors than can be corrected are present in a segment (e.g., a SEC-DED code detects a double bit error) (430), then a flag associated with that segment is set (435).

If all the segments of the cache line have not been analyzed (440), then steps 420-435 are performed on each remaining segment. First level error correction and detection can be performed on each segment sequentially or on a number of segments in parallel, depending on a number of first level decoder/corrector functional blocks configured in error control circuitry 250. Once all the segments have been analyzed, a determination is made as to whether any segment has a flag set (445). If not, then the error detection and correction process is done. The corrected cache line data can be provided to the processor core that requested the data, and the corrected cache line data can also be provided back to the cache line itself.

The term "set" is used when referring to the rendering of a status bit or similar apparatus into its logically true state. If the logically true state is a logic level one, the logically false state is a logic level zero. And if the logically true state is a logic level zero, the logically false state is a logic level one.

If a segment has a flag set (445), then an additional determination is made as to whether more than one segment has a flag set (450). If so, more errors are present in the cache line than can be corrected by second level error correction and detection. A determination would then be made whether to perform an external memory request to reload the data in the cache line (e.g., in the case of unmodified cache line data) or to otherwise resolve the error (e.g., reboot the system in the case of modified cache line data) (455).

If only one segment has a flag set (450), then a second level of error correction and detection can be performed (460). In one embodiment of the present invention, a DEC-TED analysis is performed on the entire cache line. For a BCH error correction and detection code, 20 parity bits are used to perform DEC-TED decoding and correction of a 512 bit cache line. In alternative embodiments, the coding scheme can be extended to correct higher numbers of bit errors, while increasing the number of parity bits as well. In addition, for memory regions having more than 512 bits, the number of parity bits needed to perform the DEC-TED (or higher) decoding and correction can be increased as well. Further, as discussed above, the identity of the flagged memory segment can be used to reduce the processing needed to locate the errors in the memory region.

If the error correction and detection analysis results in detecting more errors in the memory region than can be corrected (e.g., triple bit errors detected by a DEC-TED code) (465), then determination of whether to perform an external memory request to reload the data in the memory region or to otherwise resolve the error is performed (455). If the second level of error correction and detection corrects the errors found in the memory region then that corrected data can be provided to the requesting processor core and back to the memory region itself.

An alternative hierarchical error correction process can be performed on a segment-by-segment basis. For example, a SEC-DED analysis can be performed on a memory segment. If a double bit error is detected in the segment, then a DEC-TED analysis can be subsequently performed on the segment, rather than on the entire memory region. Such a segment-by-segment process is performed by having not only the parity bits for the SEC-DED analysis associated with the memory segment, but also parity bits for the DEC-TED analysis associated with the memory segment (rather than the entire memory region). The scope of the present invention is not limited to specific error correction and detection methods or to association of parity bits with memory areas. Further, alternative associations of memory segments with first and second level error correction and detection can be made, as determined appropriate for the target architecture.

Figure 6:
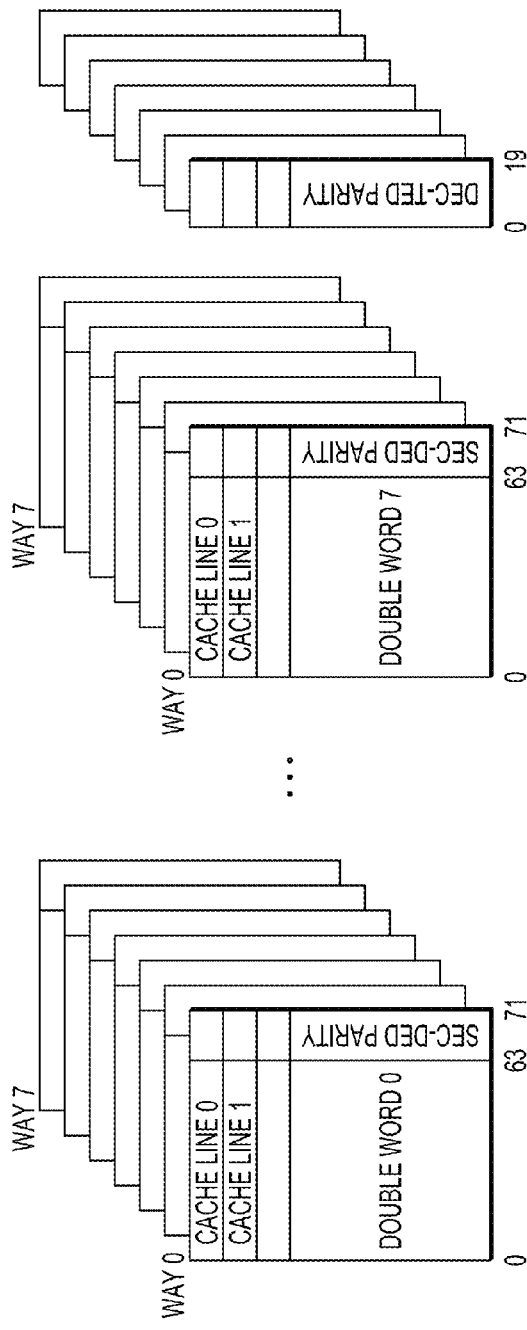
FIG. 6 illustrates an example of a cache memory configured to store parity bits, in accord with embodiments of the present invention.

FIG. 6 is a simplified block diagram illustrating an example of a cache memory configured to store parity bits, in accord with embodiments of the present invention. Cache memory configurations usable with embodiments of the present invention are not limited to single or multi-way caches. The example shown in FIG. 6 is an eight-way cache configuration having 512-bit cache lines logically divided into eight double word segments. Each double word segment has associated SEC-DED parity bits (e.g., eight bits are illustrated). Associated with each cache line are a set of DEC-TED parity bits (e.g., 20 bits are illustrated). Note that the illustration shows a logical division of the cache line memories, but physically the data for each segment can be interleaved in the cache line as discussed above.

As discussed above, in embodiments involving cache subsystems, reducing memory latency is a goal. The second level error correction/detection methods discussed above can consume more clock cycles than the first level error correction/detection methods. Thus, if the probability of multiple bit errors in a single memory segment is reduced, then latencies due to use of the second level error correction/detection methods is also reduced. There can be a higher probability of physically neighboring bits in a memory having errors, due to either manufacturing or other events (e.g., cosmic ray bit flipping). In order to reduce the probability that neighboring bit errors cause double (or more) bit errors in a memory segment, bit storage for memory segments can be interleaved to physically separate sequential bits in a memory segment.

Figure 7:
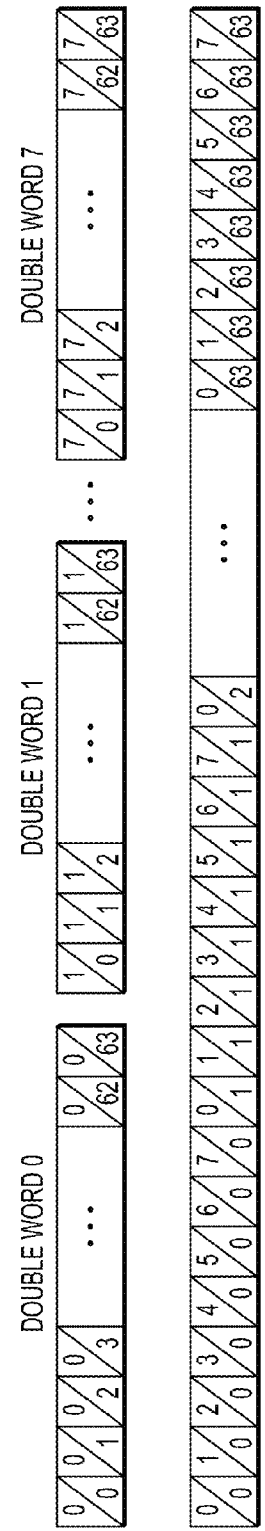
FIG. 7 illustrates interleaving of double word data bits in a corresponding cache line, according to one embodiment of the present invention.

FIG. 7 is a simplified block diagram illustrating interleaving of double word data bits in a corresponding cache line, according to one embodiment of the present invention. For the sake of illustration, double words 0-7 each have 64 bits labeled both with an identifier of the double word and a sequential identifier of the bit within the double word. When stored in the cache line, the bits associated with the double words are interleaved. For example, each first bit of each double word is stored in double word sequential order, then the second bit for each double word, and so on. In this manner, for an event to cause a double bit error in a double word, that event would have to span at least eight bits. The probability of this happening is significantly lower than the probability of neighboring bits being affected by an event. A triple bit error caused by a single event has an even lower probability in an interleaved scheme. Alternative interleaving schemes can be adopted depending upon desired memory configurations and acceptable levels of probability of event-based multi-bit errors in a single memory segment.

Figure 8:
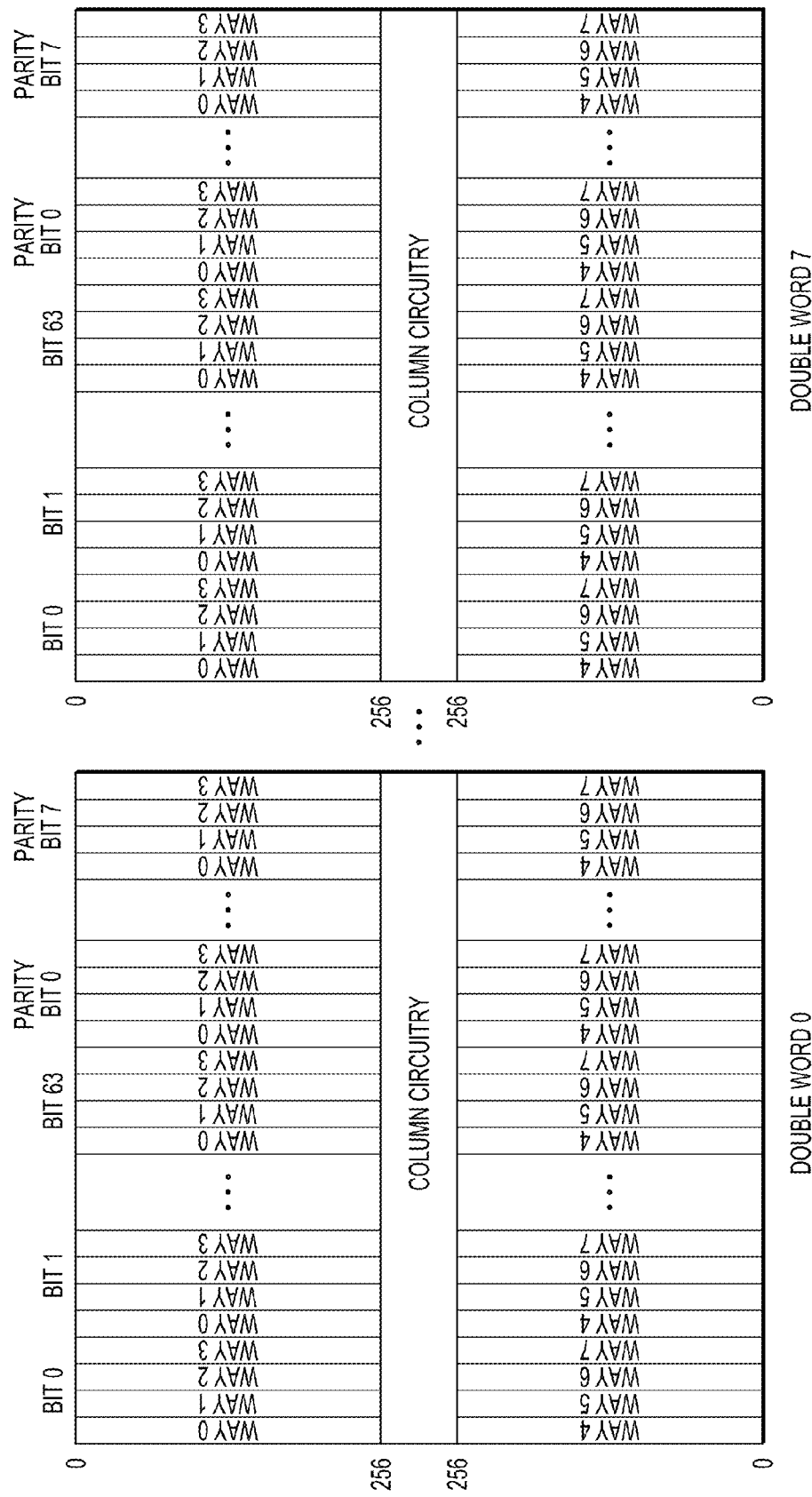
FIG. 8 is a simplified block diagram illustrating interleaving of double word data bits stored in cache lines of a multi-way cache, according to one embodiment of the present invention.

FIG. 8 is a simplified block diagram illustrating interleaving of double word data bits stored in cache lines of a multi-way cache, according to one embodiment of the present invention. FIG. 8 illustrates an eight-Way cache with each Way having 256 cache line entries each of 512 bits (e.g., FIG. 6). Each cache line is segmented into eight double words (double words 0-7) of 64 bits, and also includes eight parity bits for each double word. Bits associated with double words are stored by interleaving the associated bit columns of the Ways. For example, bit 0 of double word 0 of each of Ways 0-3 are stored sequentially, then bit 1 of double word 0 of each of Ways 0-3 are stored sequentially, and so on. As illustrated, the interleaving is done for Ways 0-3 and then Ways 4-8. Alternative Way interleaving can be performed, such as all eight Ways being interleaved. In addition, a combination of interleaving of Ways and double word bits (as in FIG. 7) can be performed. As stated above, interleaving is performed to physically separate logically neighboring bits in a double word to reduce the probability of multiple bit errors in any double word.

By now it should be appreciated that there has been provided a mechanism by which data errors in a memory region can be detected and corrected with decreased memory latency from previous memory error correction schemes. For example, single bit errors in a segment of memory are detected and corrected using a fast and efficient error correction method, which also flags the segment if more than a single bit error is present. If only single bit errors are present in the segments, then those errors are quickly resolved and no further error correction is required. Only if multi-bit errors are detected is the memory region analyzed for higher levels of bit errors using an error correction method that uses more processing resources. By dividing error correction in this manner, memory latency is minimized while maintaining reliability through higher levels of error correction.

As discussed above, a method is disclosed providing for determining the presence of data errors for each of a plurality of unique memory segments of a memory region, correcting the data error in the memory segment for each memory segment if the data error is of a first type, setting a flag associated with the memory segment if the data error is a second type, and if a flag is set for only one memory segment in the memory region, determining if the data error is a third type of error and, if not, correcting the data error for the memory region.

In one aspect of the above method, the memory region comprises a cache line of a cache memory. In a further aspect of the above method, the memory segment includes a double word. In another further aspect of the above method, if a plurality of flags are set corresponding to a plurality of memory segments, then the method further provides for reloading the cache line from a corresponding system memory location if the cache line is not dirty, or rebooting the system comprising the cache memory if the cache line is dirty. In still another further aspect of the above method, if the data error is the third type of error, then the method further provides for reloading the cache line from a corresponding system memory location if the cache line is not dirty, and rebooting a system comprising the cache memory if the cache line is dirty. In this aspect, the third type of error includes errors in at least three bits of the memory segment.

In another aspect of the above method, the first type of error includes a single bit error in the memory segment. In a further aspect, correcting the data error in the memory segment includes executing a single bit error correction Hamming code using parity bits associated with the memory segment. In yet a further aspect, the second type of error includes a double bit error in the memory segment and executing the Hamming code also determines the presence of the second type of error. In still a further aspect, correcting the second type of error includes executing a double bit error correction code using parity bits associated with the memory region and an identification of the flagged memory segment.

In another aspect of the above method, the method further provides for storing the memory segments in the memory region by interleaving bits from each memory segment.

Also as discussed above, a memory subsystem is provided that includes: a data memory storing data in one or more memory regions where each memory region comprises a plurality of unique memory segments; and an error control circuit coupled to the data memory, where the error control circuit includes a first level error detection and correction logic and a second level error detection and correction logic. The first level error detection and correction logic is configured to determine the presence of data errors for each segment of a memory region, and for each memory segment, if the data error is a first type of error, correcting the data error in the memory segment, and if the data error is a second type of error, set a flag associated with the memory segment. The second level error detection and correction logic is configured to determine if the data error is a third type of error if a flag is set for only one memory segment, and correct the data error for the memory region if the data error is not the third type of error.

In one aspect of the above memory subsystem, the error control circuit further includes an error detection and correction circuit comprising the first level and second level error detection and correction logics. In another aspect of the above memory subsystem, the error control circuit further includes an error correction encoder circuit, which is configured to generate one or more first level parity bits for each segment of a memory region for use by the first level error detection and correction logic, and generate one or more second level parity bits for each memory region for use by the second level error detection and correction logic. This aspect also provides for the error control circuit to include data memory storing the first level and second level parity bits in association with the corresponding memory region. In a further aspect, the error correction circuit is further configured to generate the first level and second level parity bits when data to be stored in the memory region is received at the memory subsystem.

In another aspect of the above memory subsystem, the error control circuit is configured to perform the determining of the presence of data errors when the data stored in a memory region is accessed. In another aspect of the above memory subsystem, the first level error detection and correction logic is further configured to perform a single bit error correction Hamming code, where the first type of error comprises a single bit error in the memory segment and the second type of error comprises a double bit error in the memory segment. In another aspect of the above memory subsystem, the second level error detection and correction logic is further configured to perform a double bit error correction polynomial code where the third type of error comprises a triple bit error in the memory region.

In another aspect of the above memory subsystem, the memory subsystem further includes the data memory being configured to store the memory segments in the memory region by interleaving bits from each memory segment. In yet another aspect of the above memory subsystem, the memory subsystem is a multi-way cache memory subsystem and further includes the data memory being configured to store the memory regions by interleaving corresponding bits of a memory region from a plurality of ways.

Further as discussed above, a cache memory subsystem is provided that includes a data memory storing data in one or more cache lines where each cache line includes a plurality of unique double word segments, and an error control circuit coupled to the data memory and including a first level error detection and correction logic and a second level error detection and correction logic. The first level error detection and correction logic is configured to determine a presence of data errors for each double word segment of a cache line when data from the cache line is accessed, and for each double word segment, if the data error is a single bit error then correct the single error in the double word segment, and if the data error is a double bit error then set a flag associated with the double word segment. The second level error detection and correction logic is configured to determine if the data error is a triple bit error in the cache line if a flag is set for only one double word segment, and correct the data error for the memory segment if the data error is not a triple bit error.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of systems 110 and 150 are circuitry located on a single integrated circuit or within a same device. Alternatively, the systems and subsystems may include any number of separate integrated circuits or separate devices interconnected with each other. For example, system memory 140 may be located on a same integrated circuit as processor 115 or on a separate integrated circuit or located within another peripheral or slave discretely separate from other elements of system 110. Peripheral modules 135 or 185 may also be located on separate integrated circuits or devices. Also for example, system 110 or 150 or portions thereof may be soft or code representations of physical circuitry or of logical representations convertible into physical circuitry. As such, the systems may be embodied in a hardware description language of any appropriate type.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

All or some of the above-discussed embodiments can be implemented by software modules that perform one or more tasks associated with the embodiments. The software modules described herein may be received elements by data processing systems 110 and 150, for example, from computer-readable storage media such as system memory 140 or 190, respectively, or other media on other computer systems. Such computer-readable storage media may be permanently, removably or remotely coupled to a data processing system. The computer-readable storage media may include non-transitory computer readable storage media, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, and the like. Other new and various types of non-transitory computer-readable storage media may be used to store the modules discussed herein. Non-transitory computer-readable storage media include all computer-readable media except for a transitory, propagating signal.

In one embodiment, data processing system 110 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
    determining presence of data errors for each of a plurality of unique memory segments of a memory region;
    for each memory segment if the data error is a first type of error, correcting the data error in the memory segment, wherein the first type of error has no more than a first number of bit errors;
    for each memory segment if the data error is a second type of error, set a flag associated with the memory segment, wherein the second type of error has a second number of bit errors that is greater than the first number of bit errors; and
    if only one memory segment in the memory region has its associated flag set, then determining if the data error is a third type of error, and in response to the data error not being the third type of error correcting the data error in the only one memory segment for the memory region, otherwise, determine a corrective action, wherein the third type of error has a third number of bit errors that is greater than the second number of bit errors.

2. The method of claim 1 wherein the memory region comprises a cache line of a cache memory.

3. The method of claim 2 wherein the memory segment comprises a double word.

4. The method of claim 2 further comprising:
    if a plurality of flags are set corresponding to a plurality of memory segments, then
        reloading the cache line from a corresponding system memory location, if the cache line is not dirty, and
        rebooting a system comprising the cache memory if the cache line is dirty.

5. The method of claim 2 further comprising:
    if the data error is the third type of error, then
        reloading the cache line from a corresponding system memory location, if the cache line is not dirty, and
        rebooting a system comprising the cache memory if the cache line is dirty, wherein the third type of error comprises errors in at least three bits of the memory segment.

6. The method of claim 1 wherein the first type of error comprises a single bit error in the memory segment.

7. The method of claim 6 wherein said correcting the data error in the memory segment comprises:
    executing a single bit error correction Hamming code using parity bits associated with the memory segment.

8. The method of claim 7, wherein
    the second type of error comprises a double bit error in the memory segment, and
    said executing the Hamming code further determines the presence of the second type of error.

9. The method of claim 8 wherein said correcting the second type of error comprises:
    executing a double bit error correction code using parity bits associated with the memory region and an identification of the flagged memory segment.

10. The method of claim 1 further comprising:
    storing the memory segments in the memory region by interleaving bits from each memory segment.

11. A memory subsystem comprising:
    a data memory storing data in one or more memory regions, wherein each memory region comprises a plurality of unique memory segments; and
    an error control circuit, coupled to the data memory, and comprising
        a first level error detection and correction logic configured to
            determine a presence of data errors for each segment of a memory region, and
            for each memory segment, if the data error is a first type of error correct the data error in the memory segment, wherein the first type of error has no more than a first number of bit errors, and if the data error is a second type of error set a flag associated with the memory segment, wherein the second type of error has a second number of bit errors that is greater than the first number of bit errors, and
        a second level error detection and correction logic configured to
            determine that the data error is a third type of error when only one memory segment has its associated flag set, and
            correct the data error for the memory region in response to the data error not being the third type of error, otherwise determine a corrective action, wherein the third type of error has a third number of bit errors that is greater than the second number of bit errors.

12. The memory subsystem of claim 11 wherein the error control circuit further comprises:
    an error detection and correction circuit comprising the first level and second level error detection and correction logics.

13. The memory subsystem of claim 11 wherein the error control circuit further comprises:
    an error correction encoder circuit configured to
        generate one or more first level parity bits for each segment of a memory region for use by the first level error detection and correction logic, and
        generate one or more second level parity bits for each memory region for use by the second level error detection and correction logic; and the data memory storing the first level and second level parity bits in association with the corresponding memory region.

14. The memory subsystem of claim 13 wherein the error correction circuit is further configured to generate the first level and second level parity bits when data to be stored in the memory region is received at the memory subsystem.

15. The memory subsystem of claim 11 wherein the error control circuit is configured to perform said determining the presence of data errors when the data stored in a memory region is accessed.

16. The memory subsystem of claim 11 wherein the first level error detection and correction logic is further configured to:
   perform a single bit error correction Hamming code, wherein
      the first type of error comprises a single bit error in the memory segment, and
      the second type of error comprises a double bit error in the memory segment.

17. The memory subsystem of claim 11 wherein the second level error detection and correction logic is further configured to:
   perform a double bit error correction polynomial code, wherein
      the third type of error comprises a triple bit error in the memory region.

18. The memory subsystem of claim 11 further comprising:
   the data memory configured to store the memory segments in the memory region by interleaving bits from each memory segment.

19. The memory subsystem of claim 11 wherein the memory subsystem is a multi-way cache memory subsystem, the memory subsystem further comprising:
   the data memory configured to store the memory regions by interleaving corresponding bits of a memory region from a plurality of ways.

20. A cache memory subsystem comprising:
   a data memory storing data in one or more cache lines, wherein each cache line comprises a plurality of unique double word segments; and
   an error control circuit, coupled to the data memory, and comprising
      a first level error detection and correction logic configured to
         determine a presence of data errors for each double word segment of a cache line when data from the cache line is accessed, and
         for each double word segment, if the data error is a single bit error then correct the single error in the double word segment, and if the data error is a two or more bit error then set a flag associated with the double word segment, and
      a second level error detection and correction logic configured to
         determine that the data error is a triple bit error in the cache line when only one double word segment has its associated flag set, and
         correct the data error for the memory region in response to the data error not being a triple bit error, otherwise determine a corrective action.

* * * * *